United States Patent
Martineau et al.

(10) Patent No.: US 8,712,466 B2
(45) Date of Patent: Apr. 29, 2014

(54) RADIO FREQUENCY SPLITTER

(75) Inventors: Baudouin Martineau, Tencin (FR); Olivier Richard, Bilieu (FR); Frédéric Gianesello, Saint Pierre d'Albigny (FR)

(73) Assignee: STMicroelectronics SA, Montrouge (FR)

(*) Notice: Subject to any disclaimer, the term of this patent is extended or adjusted under 35 U.S.C. 154(b) by 131 days.

(21) Appl. No.: 13/302,891

(22) Filed: Nov. 22, 2011

(65) Prior Publication Data

US 2012/0190316 A1 Jul. 26, 2012

(30) Foreign Application Priority Data

Jan. 24, 2011 (FR) ...................... 11 50520

(51) Int. Cl.
*H04M 1/00* (2006.01)

(52) U.S. Cl.
USPC ........ 455/550.1; 455/103; 455/118; 455/313; 455/334; 385/15; 385/31; 385/39

(58) Field of Classification Search
USPC ......... 455/103, 118, 313, 318–320, 323, 324, 455/334, 550.1, 552.1, 553.1; 385/15, 31, 385/39, 44–47
See application file for complete search history.

(56) References Cited

U.S. PATENT DOCUMENTS

| | | | |
|---|---|---|---|
| 5,202,700 A | 4/1993 | Miller | |
| 2005/0111077 A1* | 5/2005 | Hsiao et al. | 359/337 |
| 2006/0091946 A1* | 5/2006 | Mitzlaff | 330/52 |
| 2010/0259325 A1* | 10/2010 | Saunders | 330/124 R |
| 2010/0259326 A1* | 10/2010 | Corman | 330/124 R |

FOREIGN PATENT DOCUMENTS

| | | |
|---|---|---|
| EP | 1624522 | 2/2006 |
| EP | 1780828 | 5/2007 |
| JP | 2009500636 | 1/2009 |

OTHER PUBLICATIONS

République Francaise Institut National De La Propriété Industrielle, Rapport De Recherche Préliminaire (Preliminary Search Report); issued in French Patent Application No. 1150520on Jan. 24, 2011 (9 pages).

* cited by examiner

*Primary Examiner* — Nhan Le

(74) *Attorney, Agent, or Firm* — Slater & Matsil, L.L.P.

(57) ABSTRACT

A multichannel splitter formed from 1 to 2 splitters, wherein: an input terminal of a first 1 to 2 splitter defines an input of the multichannel splitter; the 1 to 2 splitters are electrically series-connected; and first respective outputs of the 1 to 2 splitters define output terminals of the multichannel splitter.

27 Claims, 6 Drawing Sheets

RADIO FREQUENCY SPLITTER

CROSS-REFERENCE TO RELATED APPLICATIONS

This application claims the priority benefit of French patent application Ser. No. 11/50520, filed Jan. 24, 2011 entitled, "Radio Frequency Splitter," which is hereby incorporated by reference to the maximum extent allowable by law.

TECHNICAL FIELD

The present invention generally relates to electronic circuits, and more specifically to electronic systems operating at high frequencies (approximately ranging from several GHz to several tens of GHz) and requiring a power splitting, respectively a power combination. The present invention especially aims at the forming of radio frequency signal combiners and of radio frequency signal splitters, for radio frequency transceiver chains.

BACKGROUND

Radio frequency transceiver chains (RF) are often equipped with frequency combiners/splitters associated with a beam-forming intended for adaptive antennas. The use of adaptive antennas enables one to create a resulting beam in the transmitter or receiver direction and to focus the transmission, for example, to increase the range towards the other system with which the transmission chain communicates.

Adaptive antennas are generally formed of several directional antennas, each individually associated with a transmit or receive channel. The different channels are individually controlled according to the direction desired for the transmission, and are combined (in receive mode) to provide a resulting signal to the processing circuits, or originate (in transmit mode) from a power splitter receiving a signal to be transmitted.

Power combiners or splitters use, in the frequency field to which the present invention applies, conductive line sections associated with impedances and generally are 2 to 1 combiners and 1 to 2 splitters. When the number of channels to be combined or divided is greater than 2, several 2 to 1 combiners or 1 to 2 splitters are cascaded to form 1 to 4, 1 to 8, 1 to 16, or other circuits. Such architectures are set, that is, the number of channels is set for a given electronic circuit. Now, not all channels are necessarily permanently used. This is especially true for adaptive antenna systems where, according to the beam forming, some channels are likely not to be used. In such a case, in transmit mode, part of the power is lost. Further, this results in particularly bulky systems since the form factor of the electronic circuit depends on the way in which the splitter/combiner is formed.

Similar problems may be encountered in other electronic architectures which operate at high frequency ranges (from several GHz to several tens of GHz). Such is for example the case for clock distribution trees as clock frequencies becomes higher and higher, in particular in the field of microprocessors.

SUMMARY OF THE INVENTION

In one aspect, embodiments of the present invention provide for a multichannel splitter formed from 1 to 2 splitters. An input terminal of a first 1 to 2 splitter defines an input of the multichannel splitter. The 1 to 2 splitters are electrically series-connected, and first respective outputs of the 1 to 2 splitters define output terminals of the multichannel splitter.

In another aspect, embodiments of the present invention provide for a radio frequency transmission system. The system includes a transmit circuit capable of receiving baseband signals and of providing a signal to be transmitted, and at least three channels, each comprising a 1 to 2 splitter, the splitters being series-connected to form a multichannel splitter. An input terminal of a first 1 to 2 splitter defines an input of the multichannel splitter, and first respective outputs of the 1 to 2 splitters define output terminals of the multichannel splitter.

DETAILED DESCRIPTION OF ILLUSTRATIVE EMBODIMENTS

Figure 1:
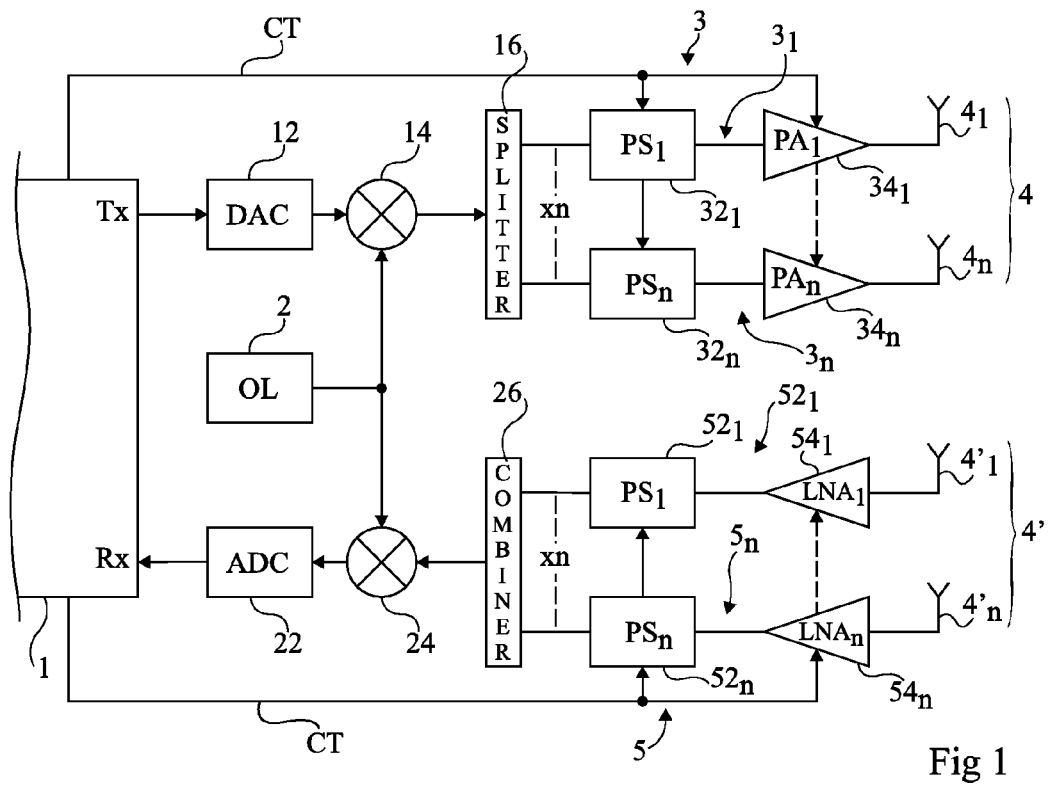
FIG. 1 is a block diagram of an embodiment of a transmission system of the type to which the described embodiments apply as an example.

An embodiment provides an architecture for combining and splitting channels conveying signals within a frequency range corresponding to radio frequencies, which overcomes all or part of the disadvantages of current architectures.

Another embodiment provides an architecture adaptable to different electronic system configurations.

Another embodiment provides a combiner of more than two channels.

Another embodiment provides a splitter of more than two radio frequency channels.

Thus, an embodiment provides a multichannel splitter formed from 1 to 2 splitters, wherein:

an input terminal of a first 1 to 2 splitter defines an input of the multichannel splitter;

the 1 to 2 splitters are electrically series-connected; and first respective outputs of the 1 to 2 splitters define output terminals of the multichannel splitter.

According to an embodiment, an amplifier of fixed gain is interposed between a second output of each 1 to 2 splitter and an input terminal of the 1 to 2 splitter of next rank.

According to an embodiment, the number of 1 to 2 splitters is equal to the number of channels.

According to an embodiment, the number of 1 to 2 splitters and of amplifiers is equal to the number of channels minus one, the output of the amplifier of the penultimate channel defining a last output terminal.

An embodiment provides a radio frequency transmission system, comprising:

a transmit circuit capable of receiving baseband signals and of providing a signal to be transmitted; and at least three channels, each comprising a 1 to 2 splitter, the splitters being series-connected to form a multichannel splitter such as described hereabove.

According to an embodiment, each circuit further comprises a 2 to 1 combiner, the combiners of the different channels being electrically series-connected.

The same elements have been designated with the same reference numerals in the different drawings. For clarity, only those elements which are useful to the understanding of the embodiments have been shown and will be described. In particular, the generation of the signals to be transmitted and the processing of the received signals have not been detailed, the present disclosure being compatible with usual generations and processings.

The embodiments which will be described refer to a radio frequency transceiver system. These embodiments more generally transpose to any architecture in which signals at radio frequencies (from several GHz to several tens of GHz) have to be conveyed in an electronic circuit. In particular, although reference will be made hereafter to radio frequency signals, the signals are not necessarily intended to be transmitted or received in an actual radio frequency transmission system and may designate signals in other applications to such frequency ranges.

In the application to radio frequency transmissions, the forming of adaptive antennas or of antenna arrays exploitable with the embodiments to be described has not been detailed, the present invention requiring no modification of such adaptive antennas or antenna arrays.

FIG. 1 is a block diagram of an embodiment of a radio frequency transmission system of the type to which the described embodiments apply as an example. On the transmit side, a signal Tx to be transmitted is shaped by an electronic transmit circuit 1. This circuit for example is a microcontroller or any other circuit for shaping data to be transmitted. The digital signal originating from circuit 1 is converted by a digital-to-analog converter 12 (DAC) to be used as a modulation signal by a carrier provided by a local oscillator 2 (OL) to a modulator 14. The output of modulator 14 is sent to a beam amplification and forming circuit 3 having the function of adapting the gain and the phase of the signal to focus the transmission of an adaptive antenna towards a receiver for which the transmission is intended.

In the example of FIG. 1, the use of an array 4 of several (n) adaptive antennas $4_1, \ldots, 4_n$ of limited radiation is assumed. Accordingly, circuit 3 comprises as many (n) channels $3_1, \ldots, 3_n$ as network 4 comprises adaptive antennas. The signal originating from modulator 14 crosses a splitter 16 (SPLITTER) to distribute the signal to the different channels $3_i$ (with i ranging between 1 and n).

Each transmit channel for example comprises a phase-shifter amplifier $32_i$ ($32_1, \ldots, 32_n$–$PS_1, \ldots, PS_n$) associated with a power amplifier $34_i$ ($34_1, \ldots, 34_n$–$PA_1, \ldots, PA_n$). The output of each transmit amplifier (channel $3_i$) is sent onto antenna $4_i$ of the concerned channel. Phase-shifter and power amplifiers $32_i$ and $34_i$ receive, from microcontroller 1, control signals CT intended to individually set the phase and the gain of each channel. These control signals are generated from measurements performed by couplers (not shown in FIG. 1) interposed on the transmit lines, generally as close as possible to the antennas.

On the receive side, a similar array 4' of antennas $4'_1, \ldots, 4'_n$ senses a signal. The antennas have been shown to be separate from the transmit antennas, but can be the same for the transmission and the reception. This is why their number is generally identical. The sensed signal is transmitted to an amplification and shaping circuit 5 comprising n (n being greater than 2) receive channels, each provided with a low-noise amplifier $54_i$ ($54_1, \ldots, 54_n$–$LNA_1, \ldots, LNA_n$) followed by a phase shifter $52_i$ ($52_1, \ldots, 52_n$–$PS_1, \ldots, PS_n$) or an amplifier/phase shifter. The outputs of amplifiers/phase shifters $52_i$ are sent to a combiner 26 (COMBINER) having its output sent onto a demodulator 24 also receiving the signal originating from local oscillator 2. The output of demodulator 24 is converted by an analog-to-digital converter 22 (ADC) having its output sent onto microcontroller 1 (signal Rx) Like for the transmission, the amplifiers (low-noise amplifiers and phase shifters) receive control signals CT from microcontroller 1 to adjust the phase and the gain.

Since the reception beam has the same direction as the transmission beam, microcontroller 1 selects the same phase-shift in transmit and in receive mode. Although this has not been shown, be it on the transmit or on the receive side, other impedance matching, coupling, and other circuits are generally present in the transceiver chains.

Figure 2:
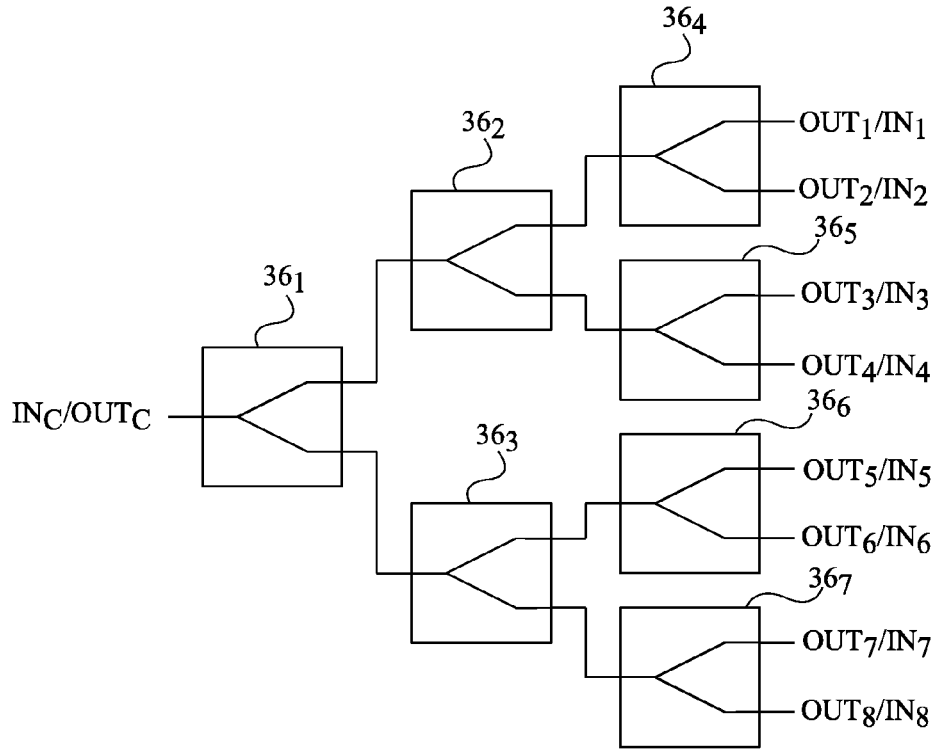
FIG. 2 is a block diagram of a conventional 8-channel radio frequency splitter or combiner architecture.

FIG. 2 schematically shows in the form of blocks an example of an 8 to 1 combiner or 1 to 8 splitter respecting a usual architecture. The circuit of FIG. 2 is formed of several 2 to 1 combiners or 1 to 2 splitters associated in cascade. A first combiner/splitter $36_1$ has its common terminal connected on the general signal side. This terminal forms either a common input terminal $IN_C$, or a common output terminal $OUT_C$. Each output terminal of the splitter, respectively input terminal of the combiner referred to as $36_1$, is connected to the input, respectively to the output, of a splitter or combiner $36_2$, $36_3$. Four channels are obtained at the output of splitters/combiners $36_2$ and $36_3$. Each of these channels is connected to the input, respectively the output, of a splitter or combiner $36_4$, $36_5$, $36_6$, $36_7$. The outputs, respectively the inputs of splitters, respectively combiners, $36_4$ to $36_7$ define output terminals $OUT_1$ to $OUT_8$, respectively input terminals $IN_1$ to $IN_8$, corresponding to 8 channels.

As appears from the cascade association of FIG. 2, seven 1 to 2 splitters or 2 to 1 combiners are required to obtain a 1 to 8 splitter or an 8 to 1 combiner. Further, due to the association of these different circuits, they must all be used. Further still, from an industrial point of view, a transmission circuit must be designed according to the number of channels and each multichannel combiner/splitter (with more than 2 channels) is dedicated to an application.

Figure 3:
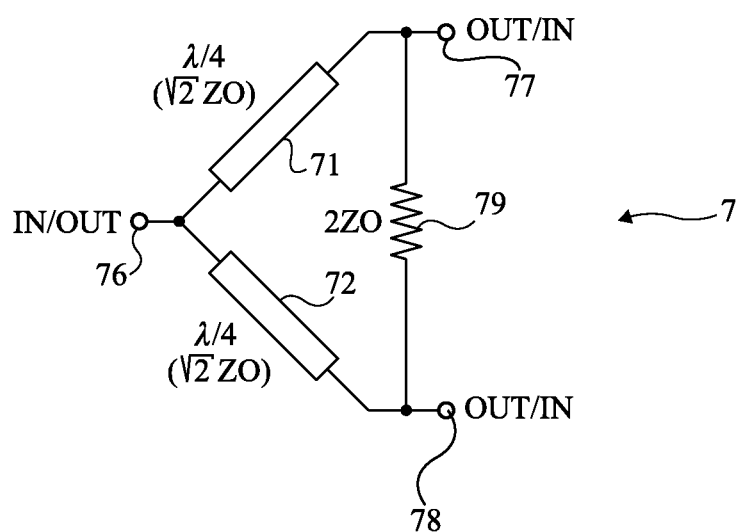
FIG. 3 shows an embodiment of a 2 to 1 combiner or 1 to 2 splitter.

FIG. 3 shows an embodiment 7 of a so-called Wilkinson 1 to 2 splitter or 2 to 1 combiner. This circuit is based on the use of two λ/4 lines 71 and 72 which are interconnected by a first end and having their other respective ends connected by a resistor 79 of value 2Z0, where Z0 is the characteristic impedance of the system (generally 50 or 75Ω). Each λ/4 line 71, 72 has an impedance of value Z0√2. The common point of lines 71 and 72 defines a terminal 76 forming input IN of the splitter or output OUT of the combiner. The other end of line 71 defines a terminal 77 forming output OUT of the splitter or input IN of the combiner. The other end of line 72 defines a second terminal 78 forming output OUT of the splitter or input IN of the combiner. Such a combiner/splitter may also be formed with local components of inductance or capacitor type. The structure of FIG. 3 is usual and capable of being used in architectures of the type in FIG. 2 as an element 36.

Figure 4:
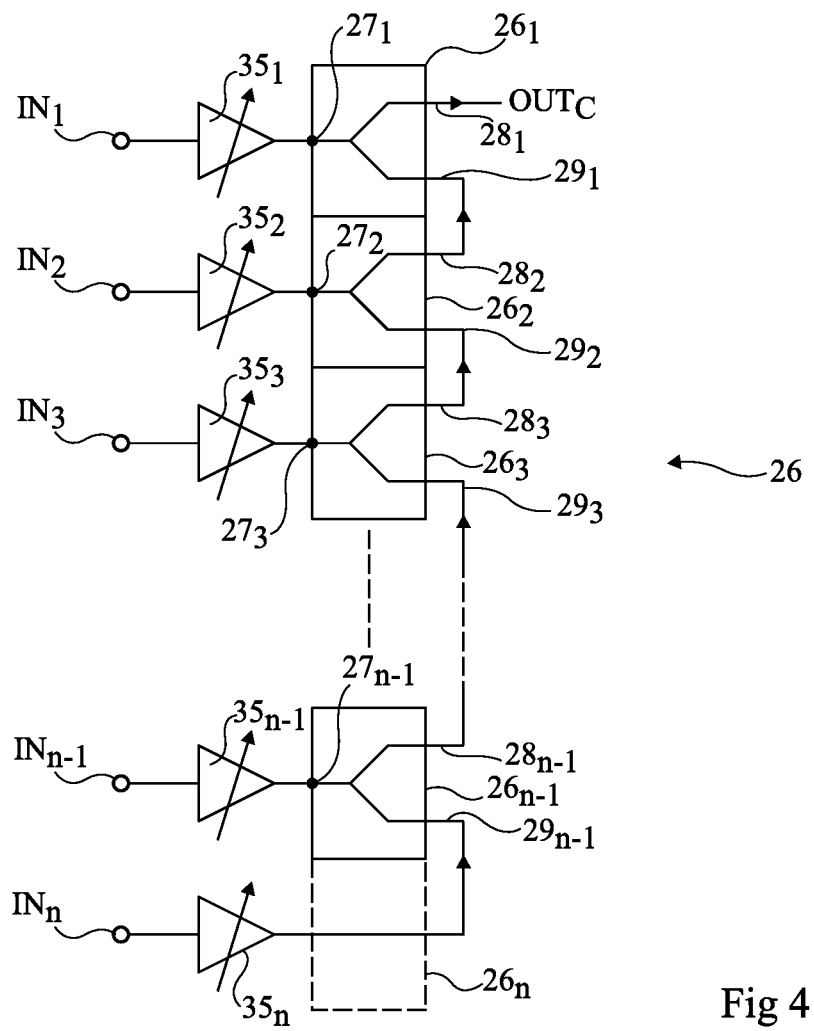
FIG. 4 is a block diagram of an embodiment of a combiner of more than 2 channels.

FIG. 4 is a block diagram of an embodiment of a multi-channel combiner 26. Circuit 26 is based on the use of 2 to 1 combiners, $26_1$ to $26_{n-1}$, where n is the number of input channels of the combiner. Circuit 26 comprises n input terminals $IN_1$ to $IN_n$. Each input terminal $IN_i$ is connected to the input of a variable-gain amplifier $35_i$ having its output, for the n−1 first channels, connected to a first input terminal $27_i$ of 2 to 1 combiner $26_i$. Combiners $26_i$ are series-connected, output terminal $28_i$ of a combiner of rank i being directly connected to the second output terminal $29_{i−1}$ of the combiner of previous rank. Output terminal $28_1$ of first combiner $26_1$ defines output terminal $OUT_C$ of combiner 26. Second input terminal $29_{n−1}$ of splitter $26_{n−1}$ of the penultimate channel receives the output of amplifier $35_n$ of the last channel.

The gains of amplifiers 35 enable compensation for the power loss due to the series association of the combiners. The respective gains $A_i$ of amplifiers $35_i$ are, for the activated channels, and neglecting the loss, equal to $A_i = A_1 + 10 \cdot \log(2^{i-2})$, where $A_1$ is the gain, in dB, of amplifier $35_1$. Thus, each channel of rank i has a gain greater by 3 dB than the channel of lower rank i−1. Contributions of same levels of each of the channels are thus obtained on the output signal present on terminal $OUT_C$.

As visually appears from FIG. 4, it is possible to deactivate an input channel, for example, by turning off the corresponding amplifier $35_i$ without altering the operation of the different combiners. Indeed, combiner $26_i$ of the deactivated channel will keep on transmitting, with a 3-dB attenuation, the signal present on its terminal $29_i$ to the combiner of lower rank.

As compared with the structure of FIG. 2, an n to 1 combiner may be formed by using n−1 2 to 1 combiners. The presence of variable-gain amplifiers is not disturbing in the architecture since such amplifiers are already present in each receive channel (see FIG. 1). It should be noted that the n-th channel may also comprise a combiner $26_n$ having its second input grounded by an impedance of value Z0. An embodiment of a multichannel architecture will be described later on in relation with FIG. 10.

Figure 5:
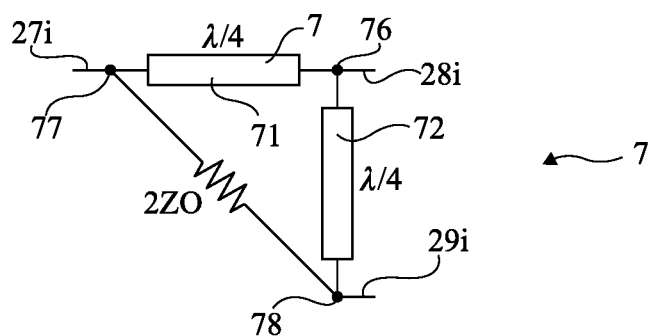
FIG. 5 illustrates the connection of an embodiment of a 2 to 1 combiner in the circuit of FIG. 4.

FIG. 5 shows a combiner 7 of the type illustrated in FIG. 3 and illustrates the assembly of such a combiner in the architecture of FIG. 4. Common terminal 76 of the two λ/4 lines 71 and 72 defines terminal $28_i$ of combiner $26_i$ of the circuit of FIG. 4. One of the two terminals 77 or 78 (in the example of FIG. 5, arbitrarily, terminal 77) defines input terminal $27_i$ of combiner $26_i$. Third terminal 78 defines terminal $29_i$ of combiner $26_i$. Although the connection is different from the usual situation of Wilkinson splitters/combiners, the circuit is effectively assembled as a combiner of the signals reaching its inputs $27_i$ and $29_i$. Other usual combiners may be used, provided for these to be 2 to 1 combiners.

Figure 6:
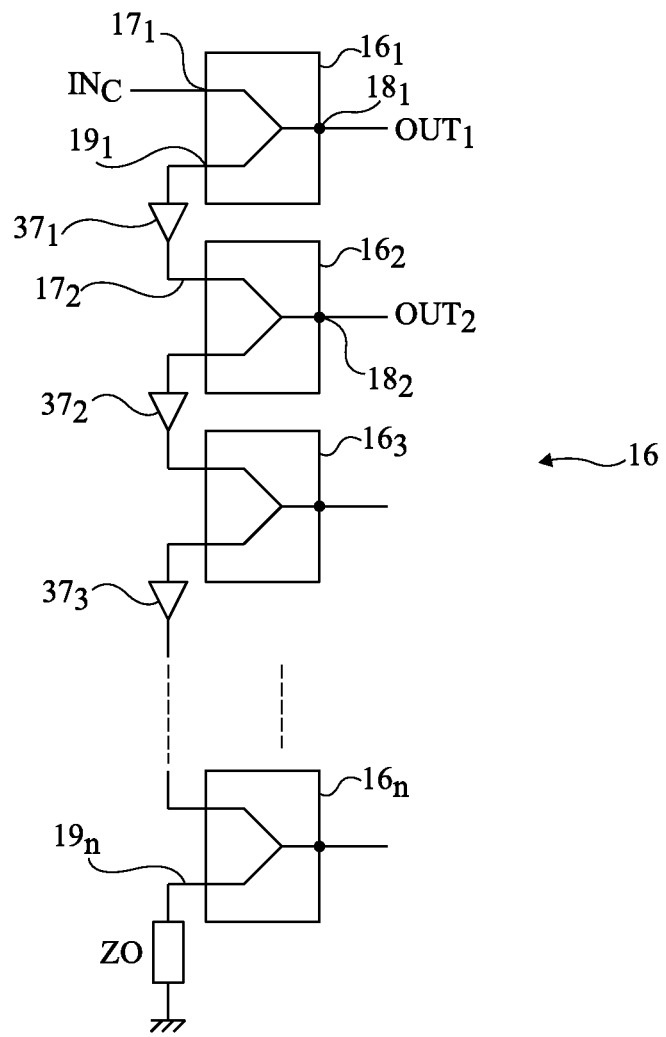
FIG. 6 shows an embodiment of a splitter towards more than 2 channels.

FIG. 6 shows an embodiment of an architecture of a power splitter 16. This 1 to n splitter is based on 1 to 2 splitters $16_i$ (with i ranging between 1 and n) by a number n equal to the number of output channels. Input terminal $17_1$ of a first splitter $16_1$ defines input terminal $IN_C$ of 1 to n splitter 16. The two other terminals (outputs) of splitter $16_1$ respectively define an output terminal $18_1$ defining first output $OUT_1$ of splitter 16 and a second output $19_1$ of splitter $16_1$. Second output $19_1$ is connected, via an amplifier $37_1$, to input $17_2$ of splitter $16_2$ of next rank. The series connection of splitters $16_i$ carries on until the last one, $16_n$, the respective outputs $18_i$ of the different splitters defining outputs $OUT_i$ of splitter 16. Second output $19_n$ of the last splitter $16_n$ is loaded with an impedance Z0 corresponding to the value of the characteristic impedance of the circuit. As a variation, the last splitter and amplifier $37_{n-1}$ of the last channel are omitted and output $19_{n-1}$ defines output $16_n$.

Neglecting the loss, each amplifier $37_i$ introduces a 3-dB gain, to compensate, from one stage to the other, the attenuation introduced by the upstream splitter and to thus balance output powers. Decreasing the number of channels is simply performed by only connecting the number of desired splitters, starting from the first one.

Figure 7:
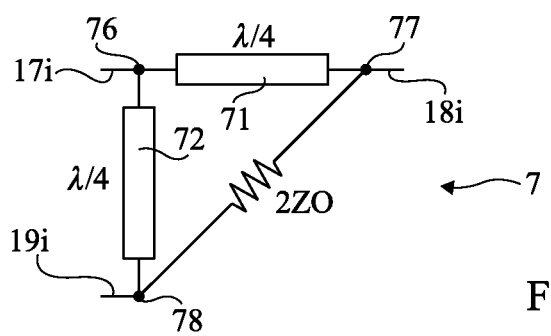
FIG. 7 illustrates the connection of an embodiment of a 1 to 2 splitter in the circuit of FIG. 6.

FIG. 7 illustrates the connection of a 2 to 1 splitter of the type in FIG. 3 in the assembly of FIG. 6. Input terminal 76 (terminal common to λ/4 lines 71 and 72) defines input terminal $17_i$ of splitter $16_i$ of rank i. A first one of the output terminals (for example, terminal 77) defines output terminal $18_i$. Second output terminal 78 (which has a function symmetrical to terminal 77) defines terminal $19_i$ connected to the next splitter.

Like for the embodiment of FIG. 4 in the combiner version, the series association of the splitters in the embodiment of FIG. 6 enables, for a given number of channels, to decrease the number of 1 to 2 splitters used.

The embodiments of FIGS. 4 and 6 may be exploited in individualized fashion in radio frequency circuits (transmission, clock tree, or other circuits). According to an embodiment more specifically intended for RF transmission architectures, these connection modes are advantageously exploited to optimize such an architecture.

Figure 8:
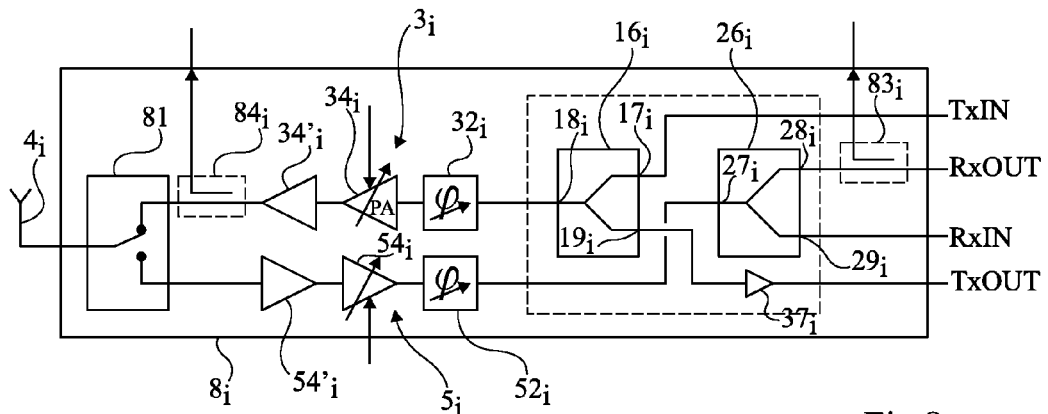
FIG. 8 is a block diagram of an embodiment of a single-channel transceiver circuit.

FIG. 8 very schematically shows in the form of blocks an embodiment of a circuit $8_i$ forming an antenna connection circuit in an architecture which will be described later on in relation with FIG. 10. Circuit $8_i$ integrates the transmit and receive portions of a transmit channel comprises circuits $3_i$ of amplification and phase shift of the transmit channel and circuits $5_i$ of amplification and phase shift of the receive channel. Transmit channel $3_i$ is associated with a splitter $16_i$ while receive channel $5_i$ is associated with a combiner $26_i$. In the example of FIG. 8, output $18_i$ of splitter $16_i$ is connected to the input of a variable-gain power amplifier $34_i$ (PA) via a variable phase-shifter $32_i$. The output of amplifier $34_i$ is connected to the input of a fixed-gain power amplifier $34'_i$ having its output connected to a first terminal of an antenna switch 81. Switch 81 is in charge of directing the transmitted signals to an antenna $4_i$ and the signals received from the antenna to the transmit channel. As a variation, two antennas ($4_i$ and $4'_i$, FIG. 1) are respectively used for the transmission and the reception. The other terminal of antenna switch 81 is connected to the input of the receive channel having its amplification and phase-shift portion comprising, in the present example, a low-noise amplifier $54'_i$ of fixed gain, followed by a low-noise amplifier $54_i$ of variable gain and by a variable phase-shifter $52_i$ having its output connected to input $27_i$ of combiner $26_i$. The role of amplifier $35_i$ (FIG. 4) of combiner 26 is played by amplifier $54_i$ of branch $5_i$. Terminals $28_i$ and $29_i$ are respectively connected to terminals RxOUT and RxIN of circuit $8_i$. Terminals $17_i$ and $19_i$ of splitter $16_i$ are respectively connected to input and output terminals, respectively TxIN and TxOUT, of circuit $8_i$, terminals $19_i$ being connected to terminal TxOUT via a fixed-gain amplifier $37_i$ introducing a 3-dB gain.

As an example, couplers $83_i$ and $84_i$ are respectively interposed between terminal $28_i$ and terminal RxOUT and between the output of amplifier $34'_i$ and antenna switch 81. These couplers are used to sample information relative to the received power and especially to the beam forming in an application to a radio frequency transmission. Several circuits $8_i$ such as illustrated in FIG. 8 are series-assembled in a transmission architecture exploiting a common transmitter.

Figure 9:
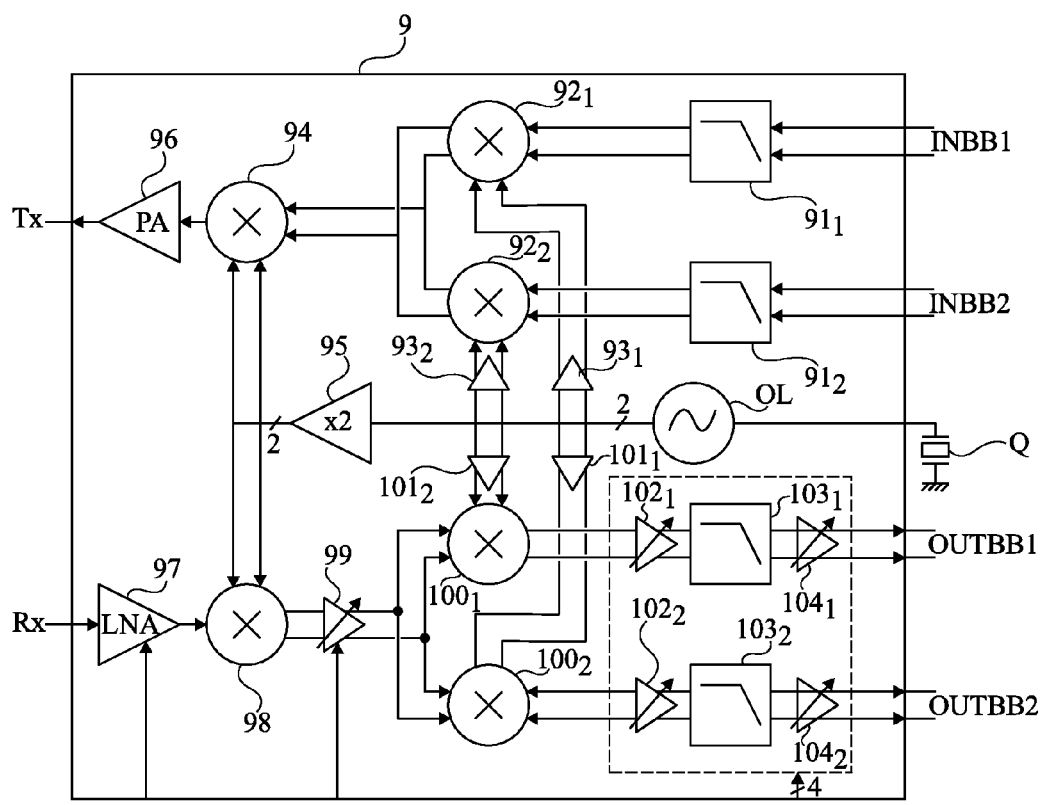
FIG. 9 is a block diagram of an embodiment of a transmitter intended to be associated with several circuits of FIG. 8.

FIG. 9 is a block diagram illustrating an embodiment of such a transmitter 9. This transmitter receives signals to be transmitted from a processing unit (for example, equivalent to circuit 1 of FIG. 1) and transmits received signals to such a processing unit. In the example of FIG. 9, differentially-processed signals are assumed. Further, an architecture with a double conversion frequency (heterodyne) is assumed. Such an architecture is based on a current structure.

Thus, circuit 9 comprises two pairs INBB1 and INBB2 of differential inputs of the baseband signals. These inputs are applied to low-pass filters $91_1$ and $91_2$ having their outputs applied to the inputs of two mixers $92_1$ and $92_2$. Mixers 92 form modulators and receive, from a local oscillator OL, signals corresponding to modulation carriers. These signals are generally amplified by amplifiers $93_1$ and $93_2$. The respective outputs of mixers $92_1$ and $92_2$ are mixed (mixer 94) and form signals of modulation, by mixer 94, of a carrier at twice the local oscillator frequency provided by a multiplier 95 of the local oscillator frequency. The output of modulator 94 is applied to the input of a power amplifier 96 (PA) having its output forming signal Tx to be transmitted.

On the transmit side, a signal Rx is applied to the input of a low-noise amplifier 97 of settable gain, having its output applied to the input of a demodulator 98 receiving the frequencies of multiplier 95. Differential outputs of demodulator 98 are applied, after crossing of a gain-control amplifier 99, to inputs of two mixers or demodulators $100_1$ and $100_2$ having second respective differential inputs receiving signals provided by the local oscillator via amplifiers $101_1$ and $101_2$. The respective outputs of demodulators $100_1$ and $100_2$ provide baseband signals to variable-gain amplifiers $102_1$ and $102_2$, having their respective outputs applied to low-pass filters $103_1$ and $103_2$. The filters provide, if desired after an additional amplification $104_1$ and $104_2$, pairs OUTBB1 and OUTBB2 of differential baseband signals.

The circuit of FIG. 9 is a simplified example based on usual components. The different signals for controlling the transmitter power supply have not been detailed. It should further be noted that, as compared with the embodiment of FIG. 1, signals INBB and OUTBB are assumed to correspond to the analog signals respectively downstream of digital-to-analog converters and upstream of analog-to-digital converters. Further, other transmit circuits may be used, without necessarily providing two modulation frequency bands.

Figure 10:
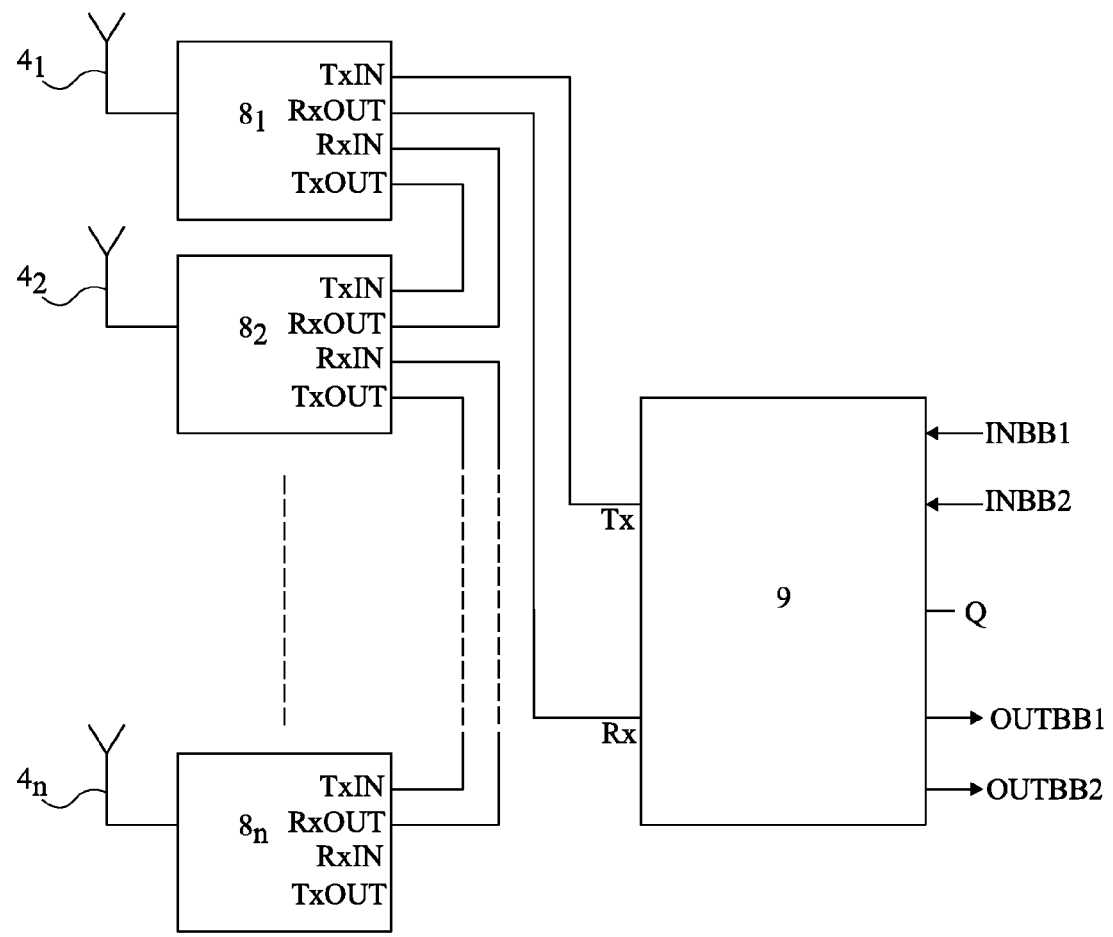
FIG. 10 is a block diagram illustrating a way to connect a transmitter such as illustrated in FIG. 9 with several circuits such as illustrated in FIG. 8.

FIG. 10 is a block diagram illustrating a transmit system based on a transmit circuit 9 of the type illustrated in FIG. 9 and of n antenna circuits $8_i$ of the type illustrated in FIG. 8. Output Tx of circuit 9 is connected to input TxIN of first circuit $8_1$ and output RxOUT of this first antenna circuit is connected to input Rx of circuit 9. Output TxOUT of the circuit of rank i is connected to input TxIN of circuit $8_{i+1}$ of next rank until circuit $8_{n-1}$, output TxOUT of circuit $8_n$ being left floating. Input RxIN of a circuit of rank i is directly connected to output RxOUT of circuit $8_{i+1}$ of next rank until the circuit of rank n-1, input RxIN of the circuit of rank n being left floating. A system such as illustrated in FIG. 10 may be integrated with a great liberty of arrangement of blocks $8_i$ and 9. This improves the form factor of the integrated circuit.

An advantage induced by the described embodiments is that the different connections between combiners and splitters do not cross outside of blocks $8_i$. This considerably eases the interconnect forming.

Various embodiments have been described. Various alterations, modifications, and improvements will occur to those skilled in the art. In particular, the selection of the gains to be introduced by the amplifiers of the combiners and splitters will be adapted, with respect to the 3-dB per channel gain, according to the loss expected in the circuit. Further, the practical implementation of the described embodiments is within the abilities of those skilled in the art based on the functional indications given hereabove. Moreover, although the embodiments have been described in relation with an example of application to a radio frequency transmission system, they more generally and individually apply to any system conveying high-frequency signals (in the radio brand from several GHz to several tens of GHz). Finally, although reference has been made to splitters and combiners in conductive lines, splitters and combiners with lumped elements (inductive and capacitive elements) may also be used.

Such alterations, modifications, and improvements are intended to be part of this disclosure, and are intended to be within the spirit and the scope of the present invention. Accordingly, the foregoing description is by way of example only and is not intended to be limiting. The present invention is limited only as defined in the following claims and the equivalents thereto.

What is claimed is:

1. A multichannel splitter comprising a plurality of 1 to 2 splitters, wherein:
   an input terminal of a first 1 to 2 splitter defines an input of the multichannel splitter;
   the 1 to 2 splitters are electrically series-connected;
   first respective outputs of the 1 to 2 splitters define output terminals of the multichannel splitter; and
   wherein each 1 to 2 splitter comprises:
     a first λ/4 line having a first end and a second end;
     a second λ/4 line having a first end and a second end, wherein the first end of the first λ/4 line and the first end of the second λ/4 line are connected together and form an input of the 1 to 2 splitter; and
     an impedance connected between the second end of the first λ/4 line and the second end of the second λ/4 line, wherein the second end of the first λ/4 line forms a first output of the 1 to 2 splitter and wherein the second end of the second λ/4 line forms a second output of the 2 to 1 splitter.

2. The splitter of claim 1, wherein an amplifier of fixed gain is interposed between a second output of each 1 to 2 splitter and an input terminal of the 1 to 2 splitter of next rank.

3. The splitter of claim 2, wherein the fixed gain is about 3 dB.

4. The splitter of claim 2, wherein the number of 1 to 2 splitters and of amplifiers is equal to the number of channels minus one, the output of the amplifier of the penultimate channel defining a last output terminal.

5. The splitter of claim 1, wherein the number of 1 to 2 splitters is equal to the number of channels.

6. A radio frequency system comprising:
   an input circuit configured to receive a baseband signal and to provide a signal to be transmitted;
   a multichannel splitter coupled to receive the signal to be transmitted, the multichannel splitter comprising a plurality of output terminals; and
   a transmit circuit having a plurality of input terminals coupled to the output terminals of the multichannel splitter and also having a plurality of output terminals coupled a plurality of antenna nodes;
   wherein the multichannel splitter comprises a plurality of 1 to 2 splitters;
   wherein an input terminal of a first 1 to 2 splitter defines an input of the multichannel splitter and is coupled to receive the signal to be transmitted;
   wherein the 1 to 2 splitters are electrically series-connected;
   wherein first respective outputs of the 1 to 2 splitters define the output terminals of the multichannel splitter;
   wherein each 1 to 2 splitter comprises:
     a first λ/4 line having a first end and a second end;
     a second λ/4 line having a first end and a second end, wherein the first end of the first λ/4 line and the first end of the second λ/4 line are connected together and form an input of the 1 to 2 splitter; and an impedance connected between the second end of the first λ/4 line and the second end of the second λ/4 line, wherein the second end of the first λ/4 line forms a first output of the 1 to 2 splitter and wherein the second end of the second λ/4 line forms a second output of the 2 to 1 splitter.

7. The system of claim 6 wherein, the radio frequency system includes at least three channels, each channel comprising one of the 1 to 2 splitters and each channel coupled to a corresponding antenna node.

8. The system of claim 7, wherein each channel further comprises a 2 to 1 combiner, combiners of different channels being electrically series-connected.

9. The system of claim 8, wherein the series-connected 2 to 1 combiners form a multichannel combiner, wherein:
an output terminal of a last 2 to 1 combiner defines an output of the multichannel combiner; and
first respective inputs of the 2 to 1 combiners define input terminals of the multichannel combiner.

10. The system of claim 8, wherein:
an output terminal of a first 2 to 1 combiner defines an input of the next 2 to 1 combiner in the series; and
an output terminal of a second next 2 to 1 combiner defines an input of the last 2 to 1 combiner in the series.

11. The system of claim 6, further comprising at least three antennas, the at least three antenna forming an antenna array, each antenna being coupled to a corresponding antenna node.

12. The system of claim 6, wherein the input circuit comprises:
a digital to analog converter coupled to receive baseband signal; and
a modulator with an input coupled to an output of the digital to analog converter and an output coupled to the multichannel splitter.

13. The system of claim 6, wherein the transmit circuit comprises:
a plurality of phase shift amplifiers, each phase shift amplifier having an input terminal coupled to a corresponding one of the output terminals of the multichannel splitter; and
a plurality of power amplifiers, each power amplifier having an input coupled to an output of a corresponding phase shift amplifier and also having an output coupled to a corresponding one of the plurality of antenna nodes.

14. A system comprising:
an electronic transmit circuit having a receive input and a transmit output;
a digital to analog converter with an input coupled to the transmit output of the electronic transmit circuit;
an analog to digital converter with an output coupled to the received input of the electronic transmit circuit;
a first modulation circuit with an input coupled to an output of the digital to analog converter;
a second modulation circuit with an output coupled to an input of the analog to digital converter;
a multichannel splitter with an input coupled to an output of the first modulation circuit, the multichannel splitter also having a plurality of outputs;
a first plurality of amplifiers, each amplifier having an input coupled to a corresponding output of the multichannel splitter;
a multichannel combiner with an output coupled to an input of the second modulation circuit, the multichannel combiner also having a plurality of inputs; and a second plurality of amplifiers, each amplifier having an output coupled to a corresponding input of the multichannel combiner;
wherein the multichannel splitter comprises a plurality of 1 to 2 splitters;
wherein an input terminal of a first 1 to 2 splitter defines an input of the multichannel splitter and is coupled to the output of the first modulation circuit;
wherein the 1 to 2 splitters are electrically series-connected;
wherein first respective outputs of the 1 to 2 splitters define the outputs of the multichannel splitter;
wherein each 1 to 2 splitter comprises:
a first λ/4 line having a first end and a second end;
a second λ/4 line having a first end and a second end, wherein the first end of the first λ/4 line and the first end of the second λ/4 line are connected together and form an input of the 1 to 2 splitter; and
an impedance connected between the second end of the first λ/4 line and the second end of the second λ/4 line; and
wherein the second end of the first λ/4 line forms a first output of the 1 to 2 splitter and wherein the second end of the second λ/4 line forms a second output of the 2 to 1 splitter.

15. The system of claim 14,
wherein the multichannel combiner comprises a plurality of 1 to 2 combiners;
wherein an input terminal of a first 1 to 2 combiner defines an input of the multichannel combiner and is coupled to the input of the second modulation circuit;
wherein the 1 to 2 combiners are electrically series-connected;
wherein first respective inputs of the 1 to 2 combiners define the inputs of the multichannel combiner;
wherein each 1 to 2 combiner comprises:
a first λ/4 line having a first end and a second end;
a second λ/4 line having a first end and a second end, wherein the first end of the first λ/4 line and the first end of the second λ/4 line are connected together and form an input of the 1 to 2 combiner; and
an impedance connected between the second end of the first λ/4 line and the second end of the second λ/4 line, wherein the second end of the first λ/4 line forms a first output of the 1 to 2 combiner and wherein the second end of the second λ/4 line forms a second output of the 2 to 1 combiner.

16. The system of claim 14, wherein each amplifier of the first plurality of amplifiers comprises a power amplifier.

17. The system of claim 16, further comprising a plurality of phase shifters, each phase shifter coupled between an output of the multichannel splitter and an input of a power amplifier.

18. The system of claim 14, wherein each amplifier of the second plurality of amplifiers comprises a low noise amplifier.

19. The system of claim 18, further comprising a plurality of phase shifters, each phase shifter coupled between an input of the multichannel combiner and an output of a low noise amplifier.

20. The system of claim 14, further comprising a plurality of antennas, each antenna coupled to an output of a corresponding one of the first plurality of amplifiers and to an input of a corresponding one of the second plurality of amplifiers.

21. The system of claim 14, wherein the is configured to process a baseband signal.

22. The system of claim 21, wherein the baseband signal is a differential signal.

23. A multichannel combiner comprising:
- a plurality of 1 to 2 combiners;
- wherein an output terminal of a first 1 to 2 combiner defines an output of the combiner;
- wherein each 1 to 2 combiner is electrically series-connected with another 1 to 2 combiner;
- wherein first respective inputs of the 1 to 2 combiners define the inputs of the combiner;
- wherein each 1 to 2 combiner comprises:
  - a first $\lambda/4$ line having a first end and a second end;
  - a second $\lambda/4$ line having a first end and a second end, wherein the first end of the first $\lambda/4$ line and the first end of the second $\lambda/4$ line are connected together and form an input of the 1 to 2 combiner;
  - an impedance connected between the second end of the first $\lambda/4$ line and the second end of the second $\lambda/4$ line; and
  - wherein the second end of the first $\lambda/4$ line forms a first output of the 1 to 2 combiner and wherein the second end of the second $\lambda/4$ line forms a second output of the 2 to 1 combiner.

24. The multichannel combiner of claim 23, wherein an amplifier of fixed gain is interposed between an output terminal of each 1 to 2 combiner and a second input terminal of the 1 to 2 combiner of next rank.

25. The multichannel combiner of claim 24, wherein the fixed gain is about 3 dB.

26. The multichannel combiner of claim 23, wherein the number of 1 to 2 splitters is equal to a number of channels of the multichannel combiner.

27. The multichannel combiner of claim 23, wherein the number of 1 to 2 splitters and of amplifiers is equal to a number of channels of the multichannel combiner minus one.

* * * * *

UNITED STATES PATENT AND TRADEMARK OFFICE
CERTIFICATE OF CORRECTION

PATENT NO.        : 8,712,466 B2                                           Page 1 of 1
APPLICATION NO.   : 13/302891
DATED             : April 29, 2014
INVENTOR(S)       : Baudouin Martineau It is certified that error appears in the above-identified patent and that said Letters Patent is hereby corrected as shown below:

In the Claims

Col. 10, line 66, claim 21, after "wherein the" insert --system--

Signed and Sealed this
Twenty-fourth Day of June, 2014

Michelle K. Lee
*Deputy Director of the United States Patent and Trademark Office*